(12) United States Patent
Chen et al.

(10) Patent No.: US 9,801,467 B2
(45) Date of Patent: Oct. 31, 2017

(54) BRACKET DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/342,562

(22) Filed: Nov. 3, 2016

(65) Prior Publication Data

US 2017/0224110 A1   Aug. 10, 2017

(30) Foreign Application Priority Data

Feb. 5, 2016   (TW) .............................. 105104225 A

(51) Int. Cl.
*A47B 96/06* (2006.01)
*A47B 88/04* (2006.01)
*H05K 7/14* (2006.01)

(52) U.S. Cl.
CPC ......... *A47B 88/044* (2013.01); *H05K 7/1489* (2013.01)

(58) Field of Classification Search
CPC ..... A47B 88/044; A47B 96/06; H05K 7/1489
See application file for complete search history.

(56) References Cited

U.S. PATENT DOCUMENTS

| 6,929,339 | B1* | 8/2005 | Greenwald | A47B 88/43 |
| | | | | 211/26 |
| 7,281,694 | B2 | 10/2007 | Allen et al. | |
| 7,552,899 | B2 | 6/2009 | Chen et al. | |
| 7,694,926 | B2 | 4/2010 | Allen et al. | |
| 7,699,279 | B2 | 4/2010 | Chen et al. | |
| 7,878,468 | B2 | 2/2011 | Chen et al. | |
| 8,231,188 | B1* | 7/2012 | Chen | A47B 88/57 |
| | | | | 312/333 |
| 8,371,454 | B2 | 2/2013 | Chen et al. | |
| 9,125,489 | B2 | 9/2015 | Chen et al. | |
| 9,526,338 | B2* | 12/2016 | Chen | A47B 47/0058 |
| 2009/0294393 | A1* | 12/2009 | Chen | H05K 7/1489 |
| | | | | 211/175 |
| 2014/0363109 | A1* | 12/2014 | Chen | A47B 88/044 |
| | | | | 384/22 |

* cited by examiner

*Primary Examiner* — Amy Sterling
(74) *Attorney, Agent, or Firm* — Rosenberg, Klein & Lee

(57) ABSTRACT

A bracket device includes a bracket, at least one mounting member mounted on the bracket, a locking member movable with respect to the bracket, and a fool-proofing member to be located at a first position or a second position with respect to the bracket. When the bracket is at a first mounting angle, the fool-proofing member is located at the first position and is unable to block the locking member from moving with respect to the bracket. When the bracket is flipped from the first mounting angle to a second mounting angle, the fool-proofing member is displaced from the first position to the second position and ends up blocking the moving path of the locking member with respect to the bracket.

20 Claims, 8 Drawing Sheets

BRACKET DEVICE

FIELD OF THE INVENTION

The present invention relates to a bracket device and more particularly to one with a fool-proofing function.

BACKGROUND OF THE INVENTION

U.S. Pat. No. 7,281,694 B2, granted to Allen et al., discloses a rack, or more specifically an equipment rack, including a plurality of posts, or vertical support columns (104), arranged in a bilaterally symmetric manner. An object, or rack-mount module (102), is mounted on the left and right vertical support columns (104) of the equipment rack via the mounting brackets (114) on a pair of slide rail assemblies and is thus mounted on the equipment rack. More specifically, in the embodiment shown in FIG. 4A to FIG. 4C of the specification of the afore-cited patent, a mounting bracket (200) has a base member (202) with a cantilevered flat spring (214). While the base member (202) of the mounting bracket (200) is being mounted to a vertical support column (104), the cantilevered flat spring (214) abuts against an end portion of the vertical support column (104) and is tilted by an angle toward a side plate (204) of the base member (202) so that a pin (210) on the base member (202) can be aligned with and mounted into a hole (106) of the vertical support column (104). Once the pin (210) is in place, the cantilevered flat spring (214) resumes the unbiased position and abuts against the vertical support column (104).

In an actual mounting operation, however, the mounting bracket on the slide rail assembly must be correctly mounted on the left or right side of the equipment rack in order to mount the rack-mount module properly into the rack. It is, therefore, common practice nowadays for slide rail assembly manufacturers to mark their products, either the slide rails or the brackets on them, with the letter "L" or "R" to facilitate identification of the particular side (i.e., left or right) for which a slide rail or bracket is intended. Nevertheless, a marked slide rail or bracket may still be mounted on the wrong side of a rack due to the operator's negligence, resulting in an error in installation or even endangering the operator and the equipment in question. The present invention was developed to solve this very problem of the prior art.

SUMMARY OF THE INVENTION

The present invention relates to a bracket device with a fool-proofing function.

According to one aspect of the invention, a bracket device includes a bracket, at least one mounting member, a locking member, and a fool-proofing member. The at least one mounting member is mounted on the bracket. The locking member can be moved with respect to the bracket. The fool-proofing member is configured to be at either one of a first position and a second position with respect to the bracket. When the bracket is at a first mounting angle, the fool-proofing member is at the first position and cannot block the locking member from moving with respect to the bracket. When the bracket is flipped from the first mounting angle to a second mounting angle, the fool-proofing member is displaced from the first position to the second position, where the fool-proofing member blocks the moving path of the locking member with respect to the bracket.

In some embodiments, the bracket of the bracket device is mountable to a slide rail and adapted to be mounted to a post, or for mounting the slide rail to a post. The bracket, preferably, includes a side plate and an end plate substantially perpendicularly connected to the side plate, wherein the bracket is to be mounted on the slide rail via the side plate, and the at least one mounting member is mounted on the end plate of the bracket. The locking member, when not being blocked by the fool-proofing member, can be moved from a locked position to an unlocked position with respect to the bracket, thus allowing the at least one mounting member to be mounted to at least one mounting hole of the post, and consequently locks the bracket device to the post. When the locking member, however, is blocked by the fool-proofing member from moving from the locked position to the unlocked position with respect to the bracket, the at least one mounting member is prevented from being mounted to the at least one mounting hole of the post. Preferably, the locking member includes a position-limiting portion, and the position-limiting portion is pressed against the side plate of the bracket in response to the locking member being in the locked position. The bracket device preferably includes an elastic member for applying an elastic force to the locking member so that the locking member can stay at the locked position.

In some embodiments, the bracket device further includes a pivotal connection member for pivotally connecting the locking member to the bracket. Preferably, the fool-proofing member is movably mounted on the pivotal connection member and can be displaced along the pivotal connection member between the first position and the second position. Moreover, the bracket preferably further includes at least one lug extending from the side plate of the bracket and configured for mounting of the pivotal connection member.

In some embodiments, the locking member includes a first feature, and the fool-proofing member includes a second feature. The fool-proofing member blocks the first feature of the locking member via the second feature when at the second position.

DETAILED DESCRIPTION OF THE INVENTION

Figure 1:
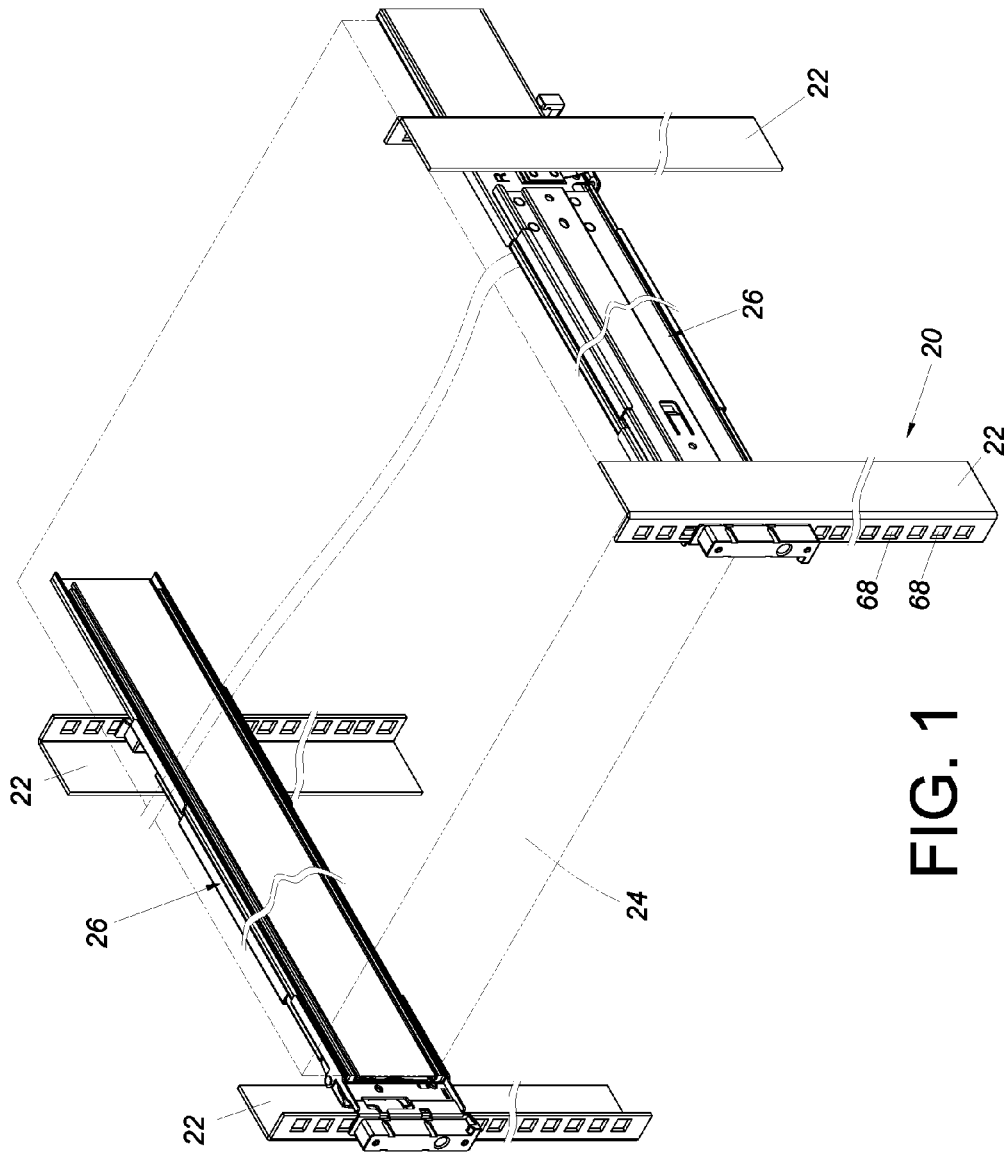
FIG. 1 is a perspective view showing how an object is mounted to a rack via a pair of slide rail assemblies according to an embodiment of the present invention.

Referring to FIG. 1, a rack 20 includes a plurality of posts 22 arranged in bilateral symmetry. An object, such as a chassis 24, is mounted on the left and right posts 22 of the rack 20 via a pair of slide rail assemblies 26 respectively and is thus mounted on the rack 20.

Figure 2:
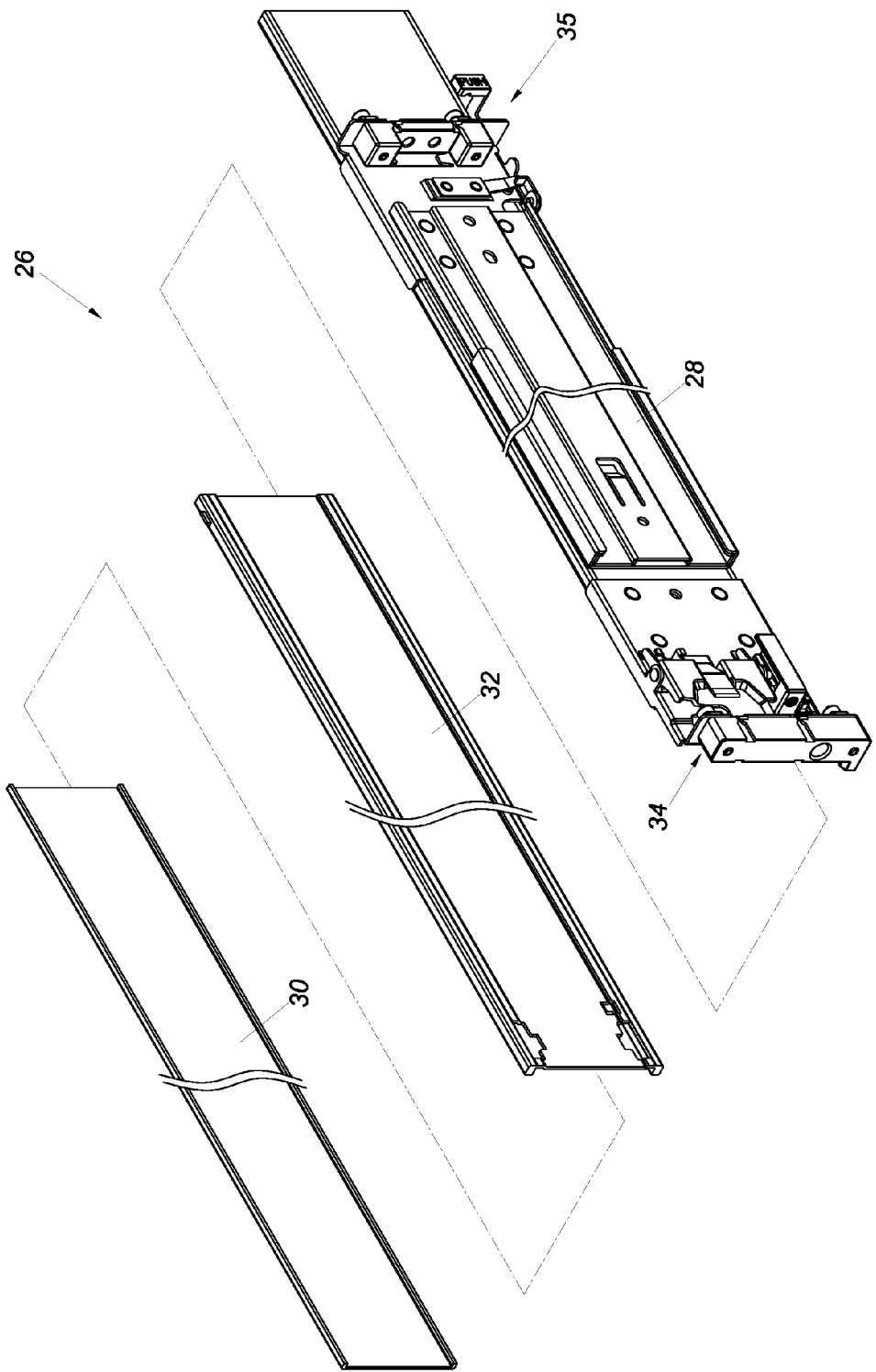
FIG. 2 is an exploded perspective view of one of the slide rail assemblies in FIG. 1.

As shown in FIG. 2, the slide rail assembly 26 in an embodiment of the present invention includes a first rail 28, a second rail 30, and a third rail 32 movably provided between the first rail 28 and the second rail 30. The third rail 32 serves to increase the distance by which the second rail 30 can be extended with respect to the first rail 28. The first rail 28 has two portions, such as a front end portion and a rear end portion, which can be mounted with a first bracket device 34 and a second bracket device 35 respectively. The slide rail assembly 26 is mounted to the rack 20 via the two bracket devices 34 and 35. To illustrate the features of the present invention clearly, the following paragraphs describe only the first bracket device 34 (hereinafter the bracket device 34 for short) by way of example.

Figure 3:
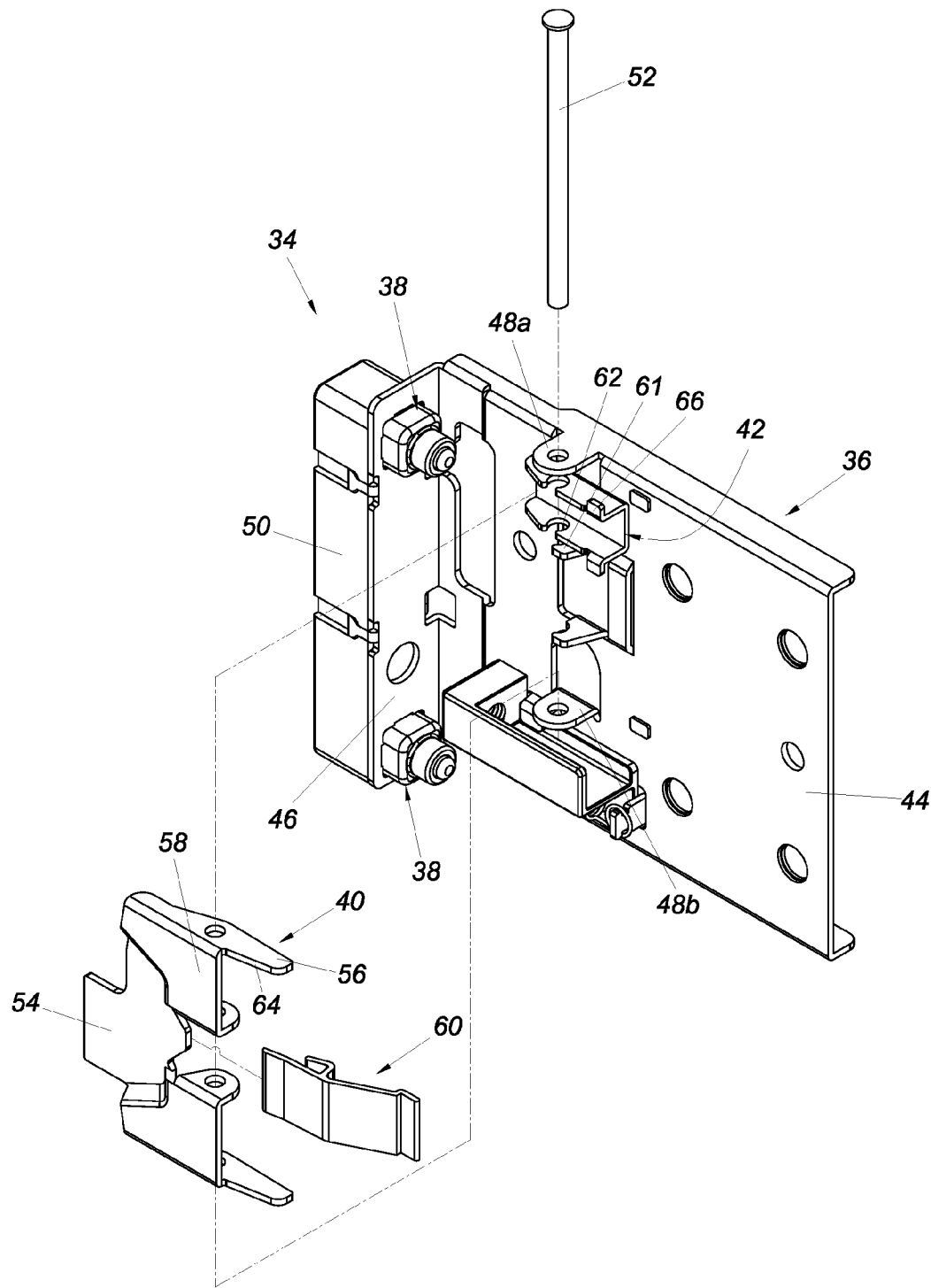
FIG. 3 is an exploded perspective view of the bracket device in FIG. 2.
Figure 4:
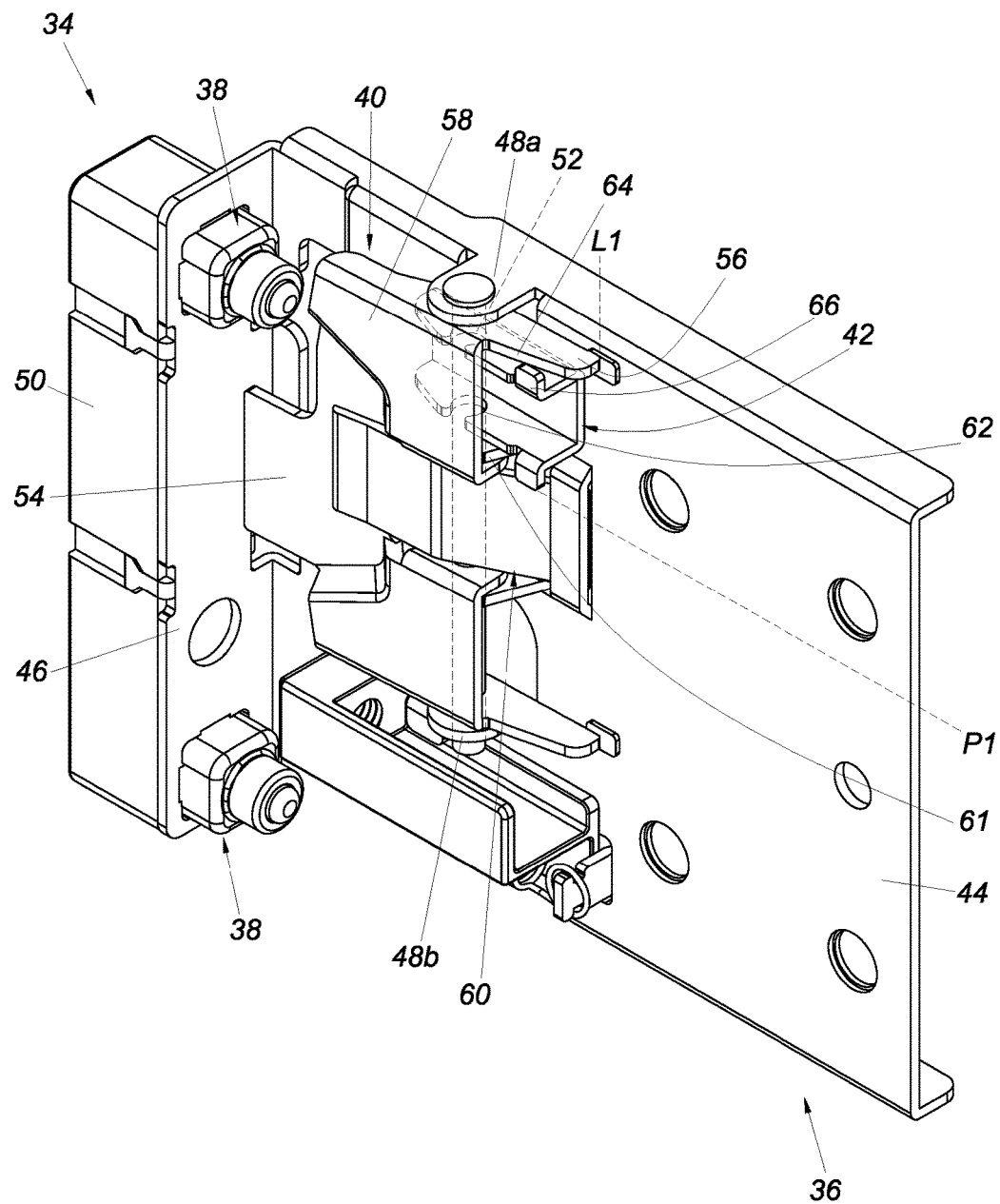
FIG. 4 is an assembled perspective view of the bracket device in FIG. 3.

As shown in FIG. 3 and FIG. 4, the bracket device 34 includes a bracket 36, at least one mounting member 38, a locking member 40, and a fool-proofing member 42. The bracket 36 has a side plate 44 and an end plate 46 substantially perpendicularly connected to the side plate 44. Preferably, at least one lug is also included and extends from the side plate 44 of the bracket 36. In this embodiment, a first lug 48a and a second lug 48b are provided by way of example, wherein the first lug 48a is spaced from the second lug 48b. In this embodiment, the first lug 48a, the second lug 48b, and the end plate 46 extend transversely with respect to the same side of the side plate 44.

The at least one mounting member 38 is mounted on the bracket 36. In this embodiment, a pair of mounting members 38 are provided by way of example. Each mounting member 38 extends through the end plate 46 of the bracket 36. Preferably, a mounting base 50 is further included and is mounted on the bracket 36. For instance, the mounting base 50 can be fixed to the end plate 46 of the bracket 36 by fastening, soldering, riveting, threaded connection, or other connecting means. Each mounting member 38 in this embodiment is mounted on the end plate 46 of the bracket 36 through the mounting base 50.

The locking member 40 is movably connected to the bracket 36. For instance, the locking member 40 is pivotally connected to the first lug 48a and the second lug 48b by a pivotal connection member 52 so as to be located on the side plate 44 of the bracket 36 and be pivotable to a locked position L1 with respect to the bracket 36. More specifically, the locking member 40 has an extended portion 54, a position-limiting portion 56, and an intermediate portion 58 between the extended portion 54 and the position-limiting portion 56. Taking the intermediate portion 58 as a reference point, the extended portion 54 lies substantially at the front end of the intermediate portion 58, and the position-limiting portion 56 lies substantially at the rear end of the intermediate portion 58. In this embodiment, the pivotal connection member 52 extends through the intermediate portion 58 and pivotally connects the locking member 40 to the first lug 48a and the second lug 48b. Preferably, an elastic member 60 is also included in order to apply an elastic force to the locking member 40, allowing the locking member 40 to stay temporarily in the locked position L1, and the position-limiting portion 56 of the locking member 40 is pressed against the side plate 44 of the bracket 36 in response to the locking member 40 being in the locked position L1. In this embodiment, the elastic member 60 is mounted between the locking member 40 and the side plate 44 of the bracket 36.

The fool-proofing member 42 is movably mounted on the bracket 36. For instance, the fool-proofing member 42 is movably mounted on and can be displaced along the pivotal connection member 52. The arrangement of the fool-proofing member 42, however, is not limited to the foregoing. The bracket 36 may provide a slide groove along which the fool-proofing member 42 can be displaced. That is to say, the fool-proofing member 42 is not necessarily designed to be displaced along the pivotal connection member 52. Preferably, the bracket 36 further has a supporting portion 61, and the fool-proofing member 42 can be displaced between the supporting portion 61 and the position-limiting portion 56 along the pivotal connection member 52. In this embodiment, the fool-proofing member 42 has an abutting portion 62 configured to slidably abut against the pivotal connection member 52. Preferably, the locking member 40 has a first feature 64, and the fool-proofing member 42 has a second feature 66. The first feature 64 can be a lateral side of the position-limiting portion 56 of the locking member 40 while the second feature 66 can be a bent portion.

Figure 5:
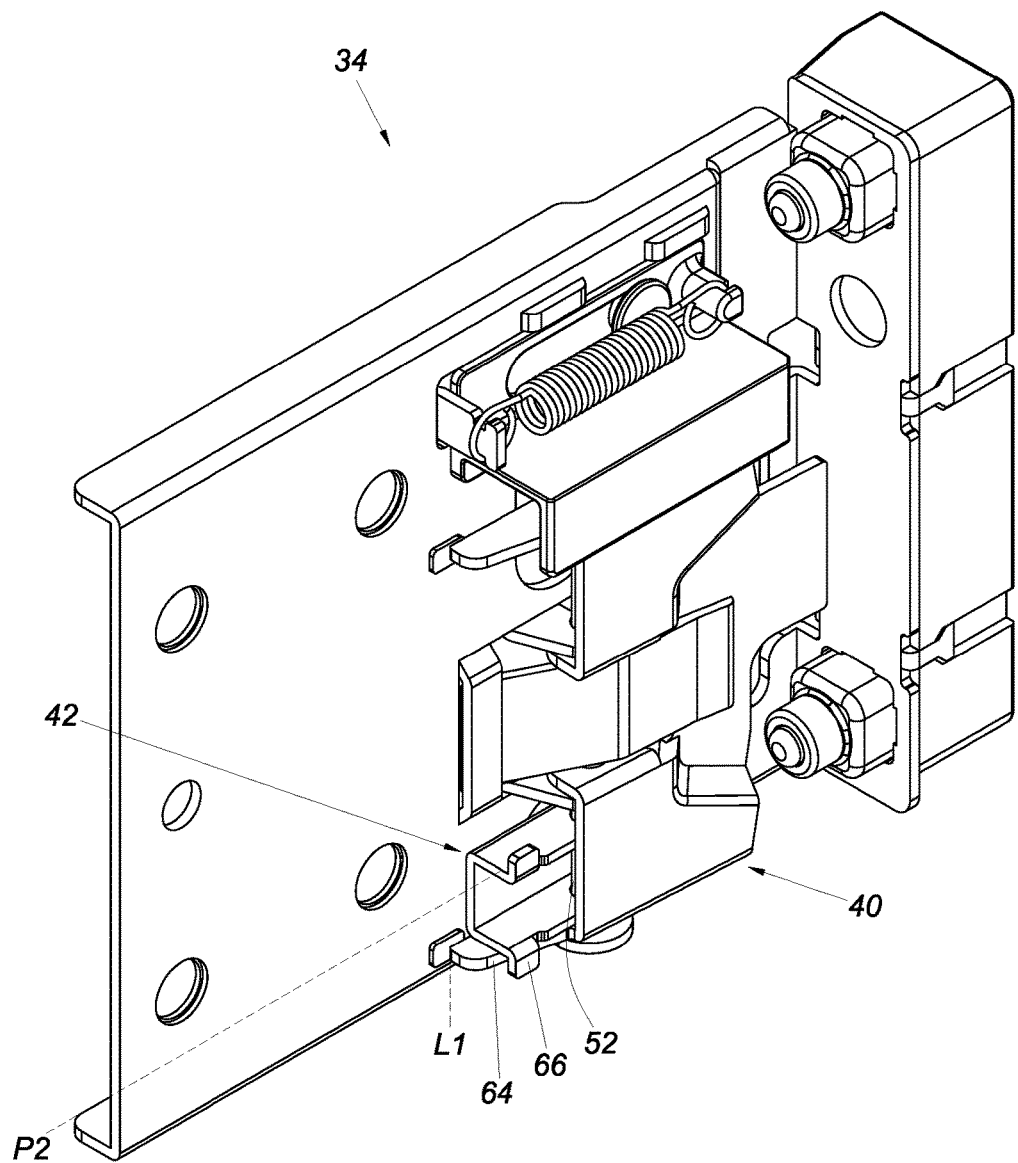
FIG. 5 shows the bracket device in FIG. 4 flipped over.

As shown in FIG. 4 and FIG. 5, the bracket device 34 (or the bracket 36) can be flipped from a first mounting angle to a second mounting angle. In this embodiment, the second mounting angle is achieved by turning 180 degrees with respect to the first mounting angle; in other words, the bracket device 34 is upside down once flipped to the second mounting angle from the first mounting angle. When the bracket device 34 is at the first mounting angle (see FIG. 4), the fool-proofing member 42 is at a first position P1, and the second feature 66 of the fool-proofing member 42 is spaced from the first feature 64 of the locking member 40 and is therefore unable to block the first feature 64 of the locking member 40. That is to say, when at the first position P1, the fool-proofing member 42 cannot block the locking member 40 from moving (e.g., pivoting) with respect to the bracket 36. The locking member 40 in this state can pivot freely with respect to the bracket 36. When the bracket device 34 is flipped from the first mounting angle to the second mounting angle (see FIG. 5), the fool-proofing member 42 is displaced along the pivotal connection member 52 from the first position P1 to a second position P2 by its own weight, and once the second position P2 is reached, the second feature 66 of the fool-proofing member 42 blocks the first feature 64 of the locking member 40 and hence blocks the moving path of the locking member 40, preventing the locking member 40 from moving from the locked position L1 to an unlocked position L2 for example. The locking member 40 in this state cannot pivot freely with respect to the bracket 36.

Figure 6:
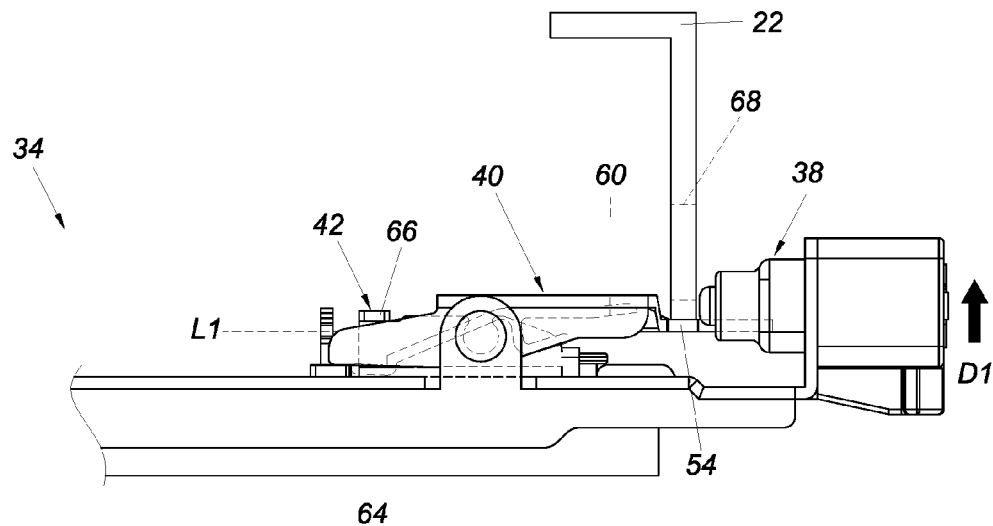
FIG. 6 shows the bracket device in FIG. 3 displaced in a first direction with respect to a post.
Figure 7:
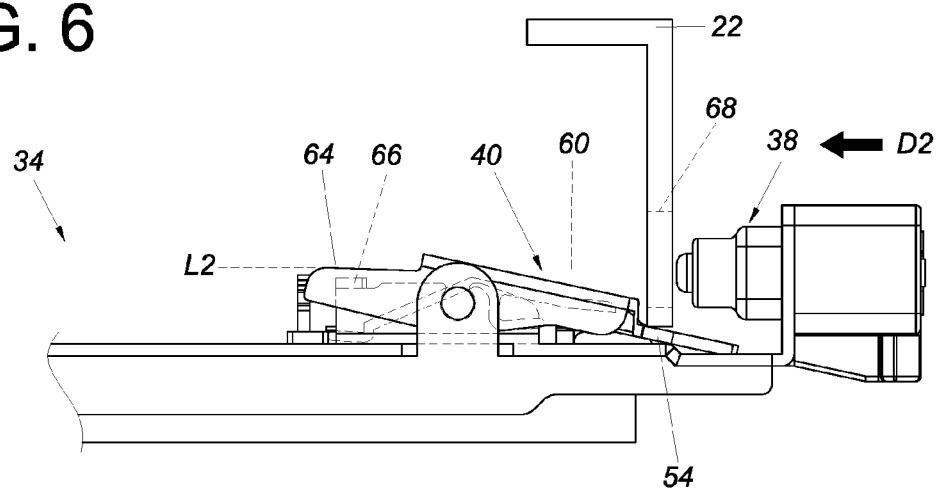
FIG. 7 is similar to FIG. 6, except that the locking member of the bracket device is tilted by an angle, allowing the at least one mounting member to be aligned with the at least one mounting hole of the post in a second direction.
Figure 8:
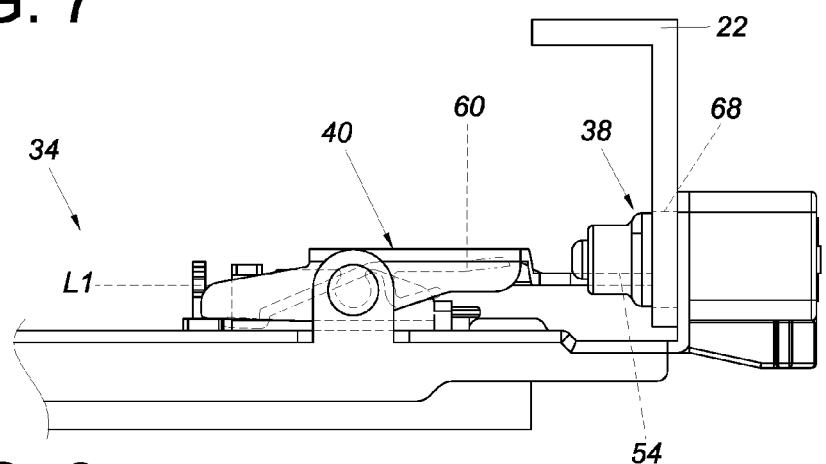
FIG. 8 shows the bracket device in FIG. 6 mounted on the post.

Referring to FIG. 6 and FIG. 7, the post 22 has at least one mounting hole 68. When the bracket device 34 (or the bracket 36) is at the first mounting angle with respect to the post 22, the second feature 66 of the fool-proofing member 42 does not block the first feature 64 of the locking member 40. During the mounting process, therefore, displacing the bracket device 34 in a first direction D1 (e.g., a transverse direction) will pivot the locking member 40 by an angle, or more particularly to the unlocked position L2, with the extended portion 54 abutting against a side of the post 22, and the elastic member 60 will store an elastic force in response to the pivoting of the locking member 40. Referring also to FIG. 8, the bracket device 34 can be further displaced in a second direction D2 (e.g., a longitudinal direction) when the locking member 40 is in the unlocked position L2, in order to mount the at least one mounting member 38 into the at least one mounting hole 68 of the post 22. Once the at least one mounting member 38 is mounted in place, the extended portion 54 of the locking member 40 no longer abuts against the post 22, so the locking member 40 returns from the unlocked position L2 to the locked position L1 in response to the elastic force of the elastic member 60 and thus locks the bracket device 34 to the post 22.

Figure 9:
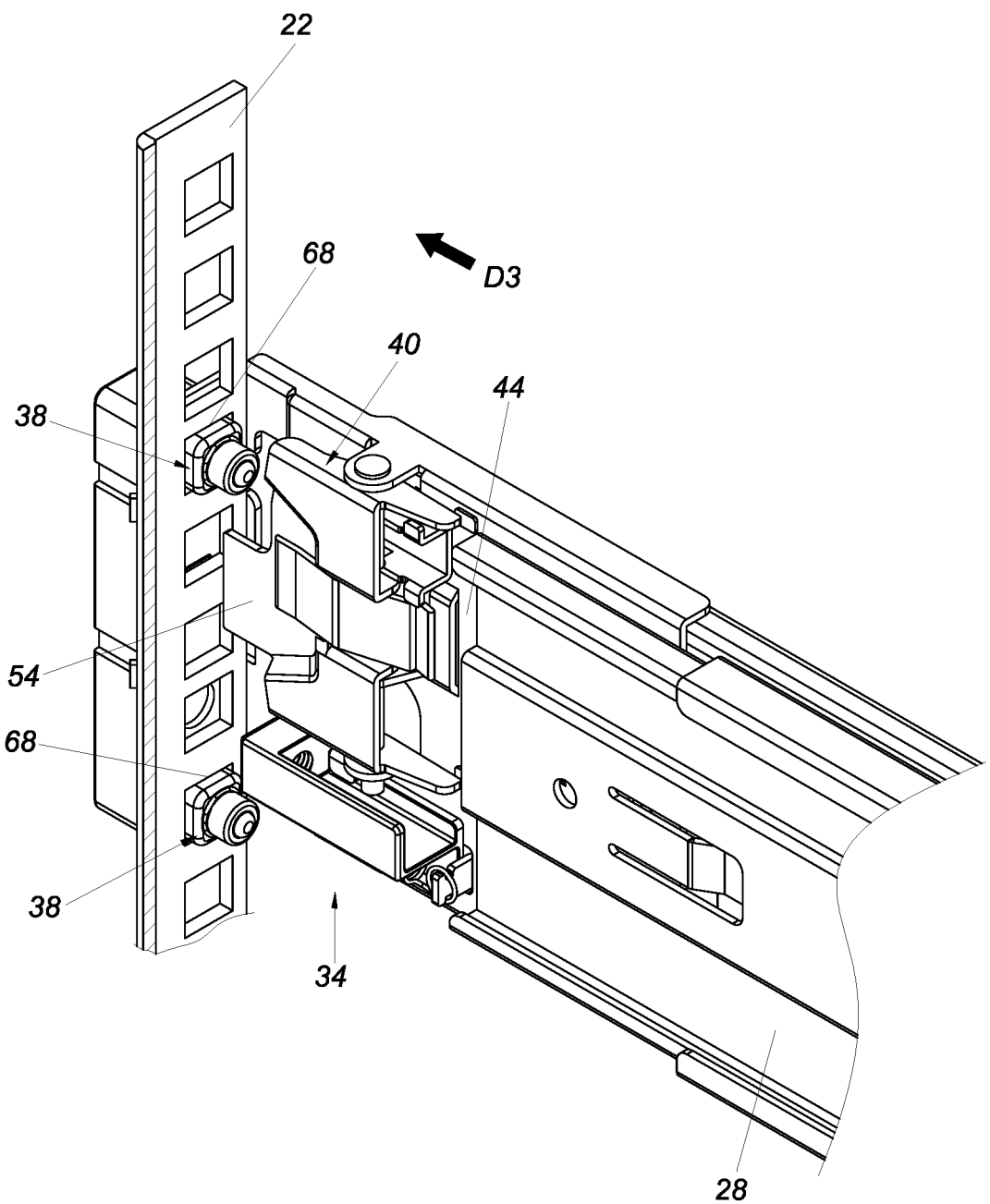
FIG. 9 is a perspective view showing the bracket device in FIG. 6 mounted on the post.

FIG. 9 shows the bracket device 34 mounted on the first rail 28 via the side plate 44. After the pair of mounting members 38 of the bracket device 34 are mounted into the two mounting holes 68 of the post 22 respectively, the locking member 40 resumes the locked position L1 and locks the bracket device 34 to the post 22. If the bracket device 34 is displaced in a third direction D3 (which is the opposite direction of the second direction D2) in the locked state, the pair of mounting members 38 are kept from moving out of the two mounting holes 68 of the post 22, and this ensures that the first rail 28 is reliably mounted on the post 22.

Figure 10:
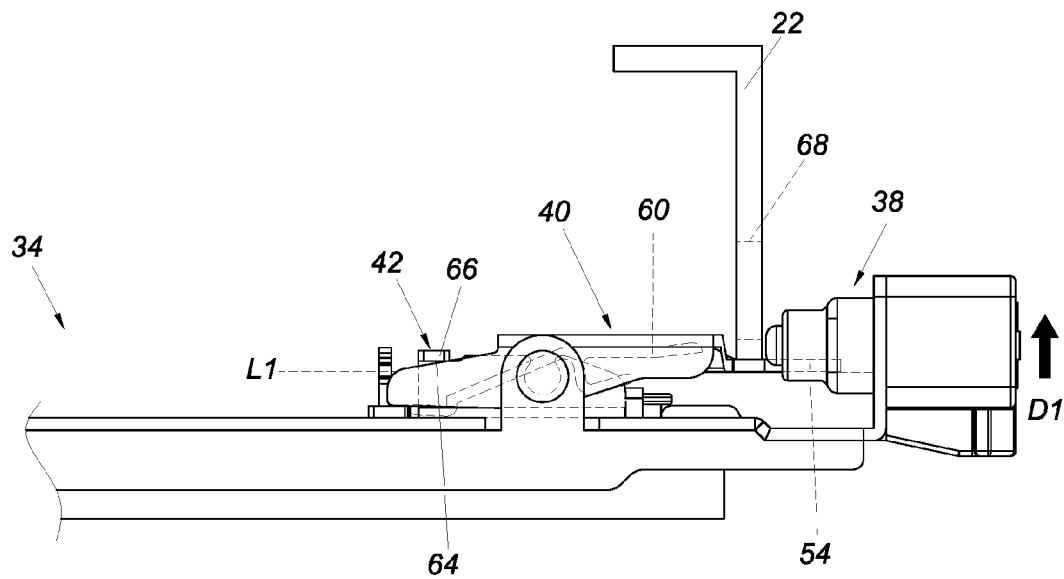
FIG. 10 is similar to FIG. 6, showing the bracket device in FIG. 3 displaced in a first direction with respect to a post, but with the locking member blocked by the fool-proofing member.
Figure 11:
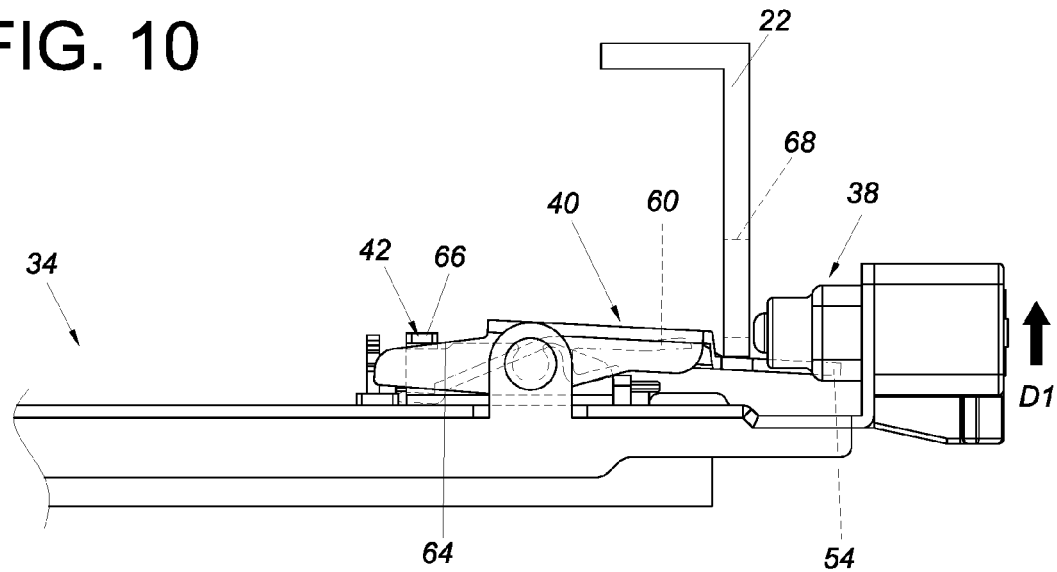
FIG. 11 shows that the bracket device in FIG. 10 cannot be further displaced in the first direction, and that therefore the at least one mounting member cannot be mounted to the post.

Referring to FIG. 10 and FIG. 11, when the bracket device 34 (or the bracket 36) is at the second mounting angle with respect to the post 22, the second feature 66 of the fool-proofing member 42 blocks the first feature 64 of the locking member 40. During the mounting process, therefore, the locking member 40 cannot be pivoted from the locked position L1 to the unlocked position L2 by displacing the bracket device 34 in the first direction D1, even though the extended portion 54 of the locking member 54 abuts against a side of the post 22. This means that the at least one mounting member 38 cannot be mounted into the at least one mounting hole 68 of the post 22 by displacing the bracket device 34 in the first direction D1.

As stated above, the bracket device 34 in this embodiment is so configured that, when it is at the first mounting angle, the at least one mounting member 38 of the bracket device 34 can be mounted to the post 22 because the fool-proofing member 42 is at the first position P1 and does not block the locking member 40; and that when the bracket device 34 is at the second mounting angle, however, the fool-proofing member 42 is at the second position P2, blocks the locking member 40, and thereby prevents the at least one mounting member 38 of the bracket device 34 from being mounted to the post 22. The bracket device 34 of the present invention can therefore be applied to each of the left and right posts 22 of the rack 20 without being mounted to the wrong post 22.

While the present invention has been disclosed through the foregoing preferred embodiment, it is understood that the embodiment is not intended to be restrictive of the invention. The scope of patent protection sought by the applicant is defined by the appended claims.

What is claimed is:

1. A bracket device adapted to be mounted to a post, the bracket device comprising:
   a bracket having a side plate and an end plate substantially perpendicularly connected to the side plate;
   at least one mounting member mounted on the end plate of the bracket;
   a locking member movable with respect to the bracket and allowed to be in either one of a locked position and an unlocked position; and
   a fool-proofing member movable with respect to the bracket and allowed to be at either one of a first position and a second position;
   wherein when the bracket device is at a first mounting angle with respect to the post, the fool-proofing member is at the first position, is unable to block the locking member from moving with respect to the bracket, and thus allows the at least one mounting member to be mounted to the post and allows the locking member to lock the bracket device to the post;
   wherein when the bracket device is at a second mounting angle with respect to the post, the fool-proofing member is displaced from the first position to the second position to block the locking member from moving from the locked position to the unlocked position with respect to the bracket and thereby prevent the at least one mounting member from being mounted to the post.

2. The bracket device of claim 1, further comprising a pivotal connection member for pivotally connecting the locking member to the bracket.

3. The bracket device of claim 1, wherein the locking member includes a position-limiting portion, and the position-limiting portion is pressed against the side plate of the bracket in response to the locking member being in the locked position.

4. The bracket device of claim 1, further comprising an elastic member for applying an elastic force to the locking member in order for the locking member to stay at the locked position.

5. The bracket device of claim 1, wherein the locking member includes a first feature, the fool-proofing member includes a second feature, and the fool-proofing member blocks the first feature of the locking member via the second feature when at the second position.

6. The bracket device of claim 2, wherein the fool-proofing member is movably mounted on the pivotal connection member and is displaceable along the pivotal connection member between the first position and the second position.

7. The bracket device of claim 2, wherein the bracket includes at least one lug extending from the side plate of the bracket and configured for mounting of the pivotal connection member.

8. A bracket device adapted for mounting a slide rail to a post, wherein the post includes at least one mounting hole, the bracket device comprising:
   a bracket including a side plate and an end plate substantially perpendicularly connected to the side plate, the bracket being mountable on the slide rail via the side plate;
   at least one mounting member mounted on the end plate of the bracket;
   a locking member movable with respect to the bracket and allowed to be in either one of a locked position and an unlocked position; and
   a fool-proofing member movable with respect to the bracket and allowed to be at either one of a first position and a second position;
   wherein when the bracket device is at a first mounting angle with respect to the post, the fool-proofing member is at the first position, is unable to block the locking member from moving with respect to the bracket, and thus allows the at least one mounting member to be mounted to the at least one mounting hole of the post and allows the locking member to lock the bracket device to the post;

wherein when the bracket device is at a second mounting angle with respect to the post, the fool-proofing member is displaced from the first position to the second position to block the locking member from moving from the locked position to the unlocked position with respect to the bracket and thereby prevent the at least one mounting member from being mounted to the at least one mounting hole of the post.

9. The bracket device of claim 8, further comprising a pivotal connection member for pivotally connecting the locking member to the bracket.

10. The bracket device of claim 8, wherein the locking member includes a position-limiting portion, and the position-limiting portion is pressed against the side plate of the bracket in response to the locking member being in the locked position.

11. The bracket device of claim 8, further comprising an elastic member for applying an elastic force to the locking member in order for the locking member to stay at the locked position.

12. The bracket device of claim 8, wherein the locking member includes a first feature, the fool-proofing member includes a second feature, and the fool-proofing member blocks the first feature of the locking member via the second feature when at the second position.

13. The bracket device of claim 9, wherein the fool-proofing member is movably mounted on the pivotal connection member and is displaceable along the pivotal connection member between the first position and the second position.

14. The bracket device of claim 9, wherein the bracket includes at least one lug extending from the side plate of the bracket and configured for mounting of the pivotal connection member.

15. A bracket device, comprising:
a bracket;
at least one mounting member mounted on the bracket;
a locking member movable with respect to the bracket; and
a fool-proofing member configured to be at either one of a first position and a second position with respect to the bracket;
wherein when the bracket is at a first mounting angle, the fool-proofing member is at the first position and is unable to block the locking member from moving with respect to the bracket;
wherein when the bracket is flipped from the first mounting angle to a second mounting angle, the fool-proofing member is displaced from the first position to the second position to block a moving path of the locking member with respect to the bracket.

16. The bracket device of claim 15, further comprising a pivotal connection member for pivotally connecting the locking member to the bracket.

17. The bracket device of claim 15, wherein the locking member includes a first feature, the fool-proofing member includes a second feature, and the fool-proofing member blocks the first feature of the locking member via the second feature when at the second position.

18. The bracket device of claim 16, wherein the fool-proofing member is movably mounted on the pivotal connection member and is displaceable along the pivotal connection member between the first position and the second position.

19. The bracket device of claim 16, wherein the bracket includes at least one lug configured for mounting of the pivotal connection member.

20. The bracket device of claim 15, wherein the second mounting angle is achieved by turning 180 degrees with respect to the first mounting angle.

* * * * *